(12) United States Patent
Bosnyak

(10) Patent No.: US 7,212,138 B1
(45) Date of Patent: May 1, 2007

(54) DELAY-BASED ANALOG-TO-DIGITAL CONVERTER

(75) Inventor: Robert J. Bosnyak, Tacoma, WA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/325,984

(22) Filed: Jan. 5, 2006

(51) Int. Cl.
*H03M 1/10* (2006.01)

(52) U.S. Cl. ............ 341/120; 341/118; 341/143; 341/155; 327/158; 327/175; 327/170; 375/376; 375/374

(58) Field of Classification Search ........... 341/118, 341/120, 143, 155; 327/158, 175, 170; 375/376, 375/174, 371
See application file for complete search history.

(56) References Cited

U.S. PATENT DOCUMENTS

| | | | | |
|---|---|---|---|---|
| 5,926,046 | A * | 7/1999 | Uchida | 327/158 |
| 6,198,417 | B1 * | 3/2001 | Paul | 341/143 |
| 6,492,922 | B1 * | 12/2002 | New | 341/120 |
| 6,518,903 | B1 * | 2/2003 | Perraud et al. | 341/143 |
| 6,531,974 | B1 * | 3/2003 | Callahan et al. | 341/144 |
| 6,774,690 | B2 * | 8/2004 | Baker et al. | 327/158 |
| 6,779,126 | B1 * | 8/2004 | Lin et al. | 713/500 |
| 6,859,081 | B2 * | 2/2005 | Hong et al. | 327/175 |
| 6,977,605 | B2 * | 12/2005 | Lee et al. | 341/161 |
| 7,119,727 | B2 * | 10/2006 | Itskovich | 341/155 |
| 7,126,396 | B1 * | 10/2006 | Courcy | 327/175 |

OTHER PUBLICATIONS

Behzad Razavi; "Chapter 6: Analog-to-Digital Converter Architectures"; *Principles of Date Conversion System Design*; Dec. 1994, Wiley-IEEE Press; pp. 96-152 (57 pages).
Behzad Razavi; "Chapter 9: Testing and Characterization"; *Principles of Data Conversion System Design*; Dec. 1994, Wiley-IEEE Press; pp. 232-251 (20 pages).
William J. Dally et al.; "Chapter 9: Timing Conventions"; *Digital Systems Engineering*; Cambridge University Press 1998; pp. 395-461 (68 pages).
William J. Dally et al.; "Chapter 10: Synchronization"; *Digital Systems Engineering*; Cambridge University Press 1998; pp. 463-513 (52 pages).
William J. Dally et al.; "Chapter 12: Timing Circuits"; *Digital Systems Engineering*; Cambridge University Press 1998; pp. 574-642 (70 pages).

* cited by examiner

*Primary Examiner*—Linh V. Nguyen
(74) *Attorney, Agent, or Firm*—Osha Liang LLP

(57) ABSTRACT

An analog-to-digital converter generates and adjusts a digital signal based on a delay caused by an analog signal. The analog signal controls a delay of a first delay chain, and the digital signal controls a delay of a second delay chain. Dependent on a comparison of an output of the first delay chain and an output of the second delay chain, circuitry of the analog-to-digital converter adjusts the digital signal.

21 Claims, 4 Drawing Sheets

DELAY-BASED ANALOG-TO-DIGITAL CONVERTER

STATEMENT REGARDING FEDERALLY SPONSORED RESEARCH OR DEVELOPMENT

The present invention was made with the support of the government of the United States under contract NBCH020055 awarded by the Defense Advanced Research Projects Administration. The United States government may have certain rights in the present invention.

BACKGROUND

A computer system includes several components that are collectively used by a user to perform various functions such as, for example, preparing and generating a document with a word-processing application. Using the computer system, the user may input data to a computing portion using peripheral devices such as a keyboard or a mouse. Data may also be provided to the computing portion using data storage media, e.g., a floppy disk or a CD-ROM. The computing portion, using memory and other internal components, processes both internal data and data provided to the computing portion by the user to generate data needed by the computer system and/or requested by the user. The generated data may be provided to the user via, for example, a display device or a printer.

The computing portion of a computer system typically includes various components such as, for example, a power supply, disk drives, and the electrical circuitry required to perform the necessary and requested operations of the computer system. The computing portion may contain a plurality of circuit boards on which various circuit components are implemented. For example, a computing portion designed to have enhanced sound reproducing capabilities may have a circuit board dedicated to implementing circuitry that specifically operates to process data associated with the reproduction of sound.

On a circuit board, a crystal oscillator provides a reference of time to various integrated circuit (IC) packages that are connected onto the circuit board. Those skilled in the art will recognize that the integrated circuit packages may be used to house and support various types of integrated circuits (e.g., application specific integrated circuits (ASICs), field-programmable gate arrays (FPGAs), microprocessors, and digital logic chips). The integrated circuit packages communicate with one another, i.e., pass data, using wires or traces of conductive material (e.g., copper or gold) embedded in the circuit board.

Within a computer system, signals between components and devices of the computer system may either be analog or digital. An analog signal takes on continuous values within some range of values and a digital signal has discrete values within some range of values. For example, in a system having a supply voltage of 1V, an analog signal may have a value anywhere between 0V and 1V, whereas a digital signal in the same system might have a value of either 0V or 1V.

Often, it may be necessary to convert between analog and digital values. For example, an analog signal generated by a temperature sensor in a computer system may need to be converted to a digital signal for use by a digital-based integrated circuit. Such conversion may be achieved using an analog-to-digital converter.

SUMMARY

According to one aspect of one or more embodiments of the present invention, a computer system comprises: a first plurality of delay elements having a delay dependent on an analog signal; a second plurality of delay elements having a delay dependent on a digital signal; and circuitry arranged to adjust the digital signal dependent on an output of the first plurality of delay elements and an output of the second plurality of delay elements.

According to another aspect of one or more embodiments of the present invention, a computer system comprises: circuitry arranged to generate a digital signal dependent on an arrival time of a first signal at a first input thereto and an arrival time of a second signal at a second input thereto; a first delay element having a delay dependent on an analog signal, where the first signal is dependent on the first element; and a second delay element having a delay dependent on the digital signal, where the second signal is dependent on the second delay element.

According to another aspect of one or more embodiments of the present invention, a computer system comprises: a first delay chain having an output operatively connected to a first node, where a delay of the first delay chain is dependent on an analog signal operatively connected to the first delay chain; a second delay chain having an output operatively connected to a second node, where a delay of the second delay chain is dependent on a digital signal operatively connected to the second delay chain; and circuitry arranged to adjust the digital signal dependent on a first input thereto and a second input thereto, the first input operatively connected to the first node and the second input operatively connected to the second node.

According to another aspect of one or more embodiments of the present invention, a method of performing computer system operations comprises: inputting an analog signal; delaying a first signal dependent on the analog signal; comparing the first signal and a second signal; generating a digital signal dependent on the comparing, where a delay of the second signal is dependent on the digital signal.

Other aspects of the present invention will be apparent from the following description and the appended claims.

DETAILED DESCRIPTION

Figure 1:
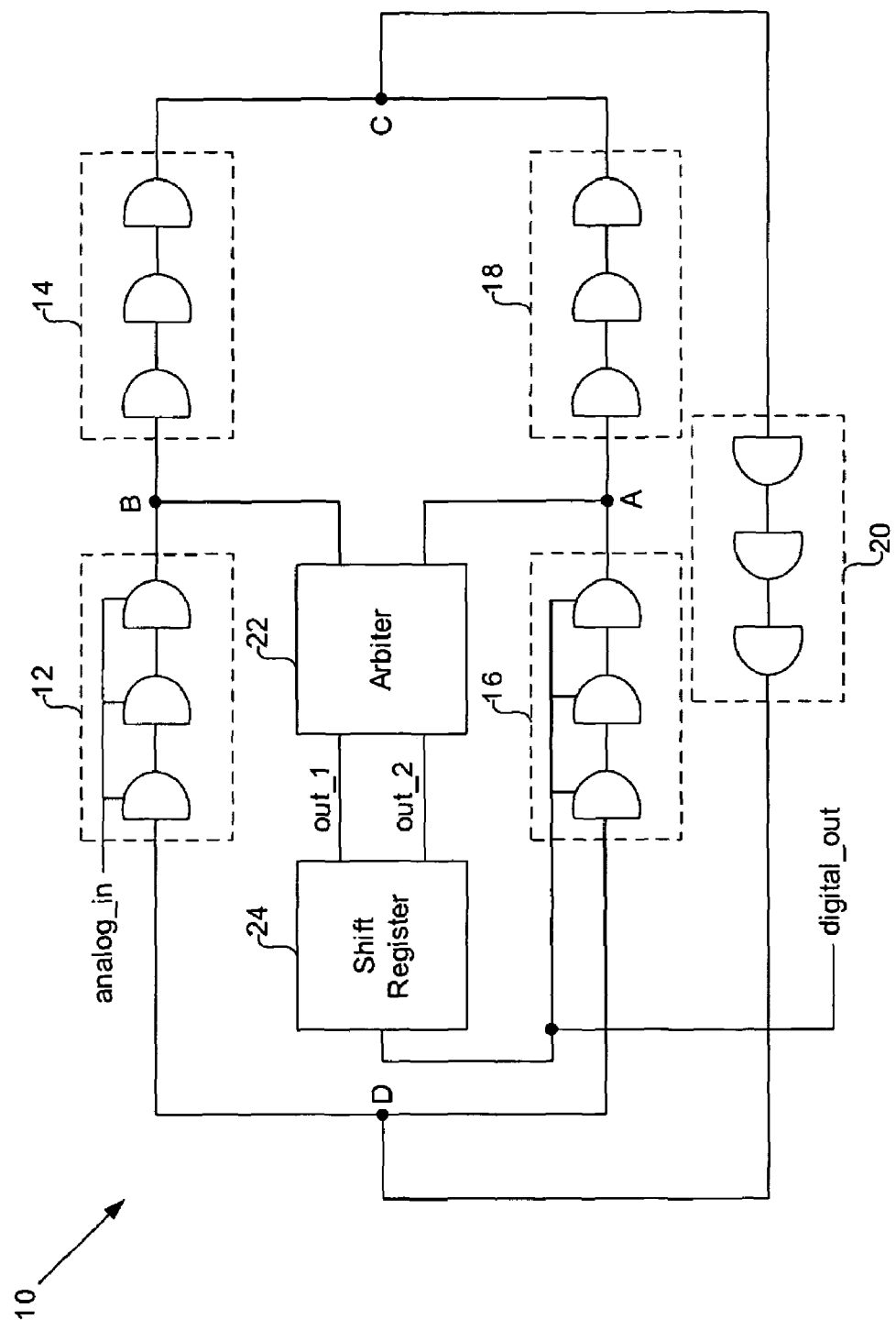
FIG. 1 shows an analog-to-digital converter in accordance with an embodiment of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Embodiments of the present invention relate to an analog-to-digital converter. FIG. 1 shows an exemplary analog-to-digital converter 10 in accordance with an embodiment of the present invention. The analog-to-digital converter 10 is formed of five groups 12, 14, 16, 18, and 20 of delay elements. Groups 12, 14, and 20 form a first delay loop path that traverses nodes A, B, and C, where group 20 serves to feed back an output signal of group 14 to an input of group 12. Groups 16, 18, and 20 form a second delay loop path that traverses nodes A, D, and C, where group 20 serves to feed back an output signal of group 18 to an input of group 16.

Those skilled in the art will note that although the groups of delay elements shown in FIG. 1 are shown has having specific numbers of delay elements, in one or more other embodiments of the present inventions, any number of delay elements may be used.

An analog signal analog_in serves as an input to and effectively controls the delay of group 12. Variance in the analog signal analog_in effects an arrival time of an output signal of group 12 at node B. Variance in the analog signal analog_in may result from various stimuli such as, for example, light, temperature, strain, capacitance, pressure, and a Hall effect.

The output signal of group 12 at node B, in addition to serving as an input to group 14, serves as an input to arbiter circuitry 22. An output signal of group 16 at node D, in addition to serving as an input to group 18, also serves as an input to arbiter circuitry 22.

Arbiter circuitry 22 determines the arrival order of signals at nodes A and B. Dependent on this arrival order, arbiter circuitry 22 generates signals out_1 and out_2 to digital control 24. Those skilled in the art will note that a plurality of arbiter circuitry blocks may be implemented dependent on a range of the analog signal analog_in. Shift register 24 uses signals out_1 and out_2 to generate a digital signal digital_out that serves as an input to and effectively adjusts a delay of group 16. Thus, if the delays of groups 12 and 16 match, the arrival of the signals at nodes A and B are coincident, in which case arbiter circuitry 22 and shift register 24 generate the digital signal digital_out with a value that does not result in an adjustment of the delay of group 16. However, if the delays of groups 12 and 16 do not match, the arrival of the signals at nodes A and B is out of order, in which case arbiter circuitry 22 and shift register 24 generate the digital signal digital_out with a value that does result in an adjustment of the delay of group 16. Further, the value of the digital signal digital_out corresponds the analog signal analog_in.

Those skilled in the art will note that a variety of ways may be used to adjust the delay of group 16. For example, in one or more embodiments of the present invention, a value of the digital signal digital_out may be related to a load of the delay elements in group 16. In one or more other embodiments of the present invention, a value of the digital signal digital_out may be related to drive currents of the delay elements in group 16.

Groups 14 and 18 serve to buffer a merging of signals of the first delay loop path (traversing nodes A, C, and D) and the second delay loop path (traversing nodes B, C, D) at node C. As described above, group 20 feeds back the signal at node C to node A. Further, in one or more embodiments of the present invention, node C may be implemented as a Mueller element. Those skilled in the art will note that a Mueller element may be used to merge transitions of two signals.

Figure 2:
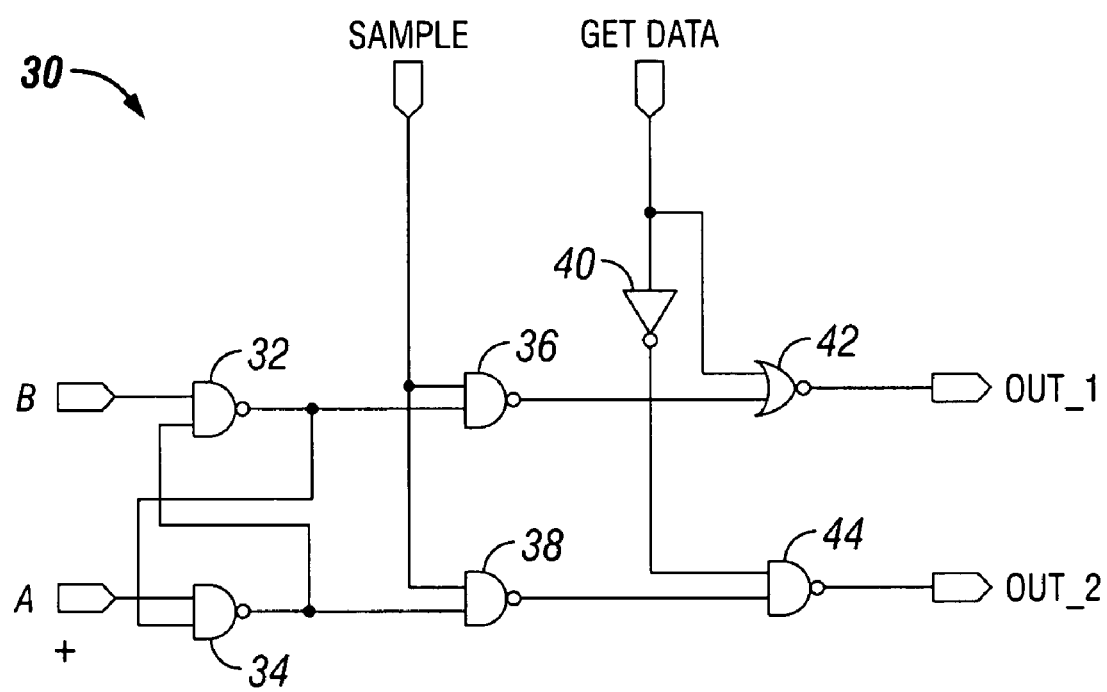
FIG. 2 shows a portion of an analog-to-digital converter in accordance with an embodiment of the present invention.

FIG. 2 shows an example of a portion of an analog-to-digital converter in accordance with an embodiment of the present invention. Particularly, FIG. 2 shows a circuit schematic of an example of an arbiter circuit 30 usable in the analog-to-digital converter 10 shown in FIG. 1.

Nodes A and B serve as inputs to logic gates 34 and 32, respectively. An output of logic gate 34 is connected to another input of logic gate 32. Further, an output of logic gate 32 is connected to another input of logic gate 34. The output of logic gate 34 serves as an input to logic gate 38, and the output of logic gate 32 serves as an input to logic gate 36. Further, a sampling signal sample also serves as an input to both logic gates 36 and 38.

An output of logic gate 36 serves as an input to logic gate 42. A signal get_data also serves as an input to logic gate 42. Logic gate 42 has an output that serves as signal out_1.

An output of logic gate 38 serves as an input to logic gate 44. The signal get_data, via inverter 40, also serves as an input to logic gate 44. Logic gate 44 has an output that serves as signal out_2.

If signal get_data is "high," the data in the shift register is caused to be shifted out. This may occur when the contents of the shift register are desired to be seen. In other words, when signal get_data is asserted "high," the shift register streams out a digital word as a serial sequence of bits. Further, in one or more embodiments of the present invention, signal get_data may be asserted only after enough cycles have occurred to allow the arbiter to shift and reach equilibrium. In one or more embodiments of the present invention, a counter may be used to count the number of cycles before signal get_data is asserted. In one or more other embodiments of the present invention, signal get_data may be asserted by another circuit.

Now referring also to FIG. 1, in one or more embodiments of the present invention, a signal in analog-to-digital converter 10 taken after nodes A and B transition "high" may used to generate control signals such as, for example, sampling signal sample (described below) and signal clock (described below). For example, the sampling signal sample may be generated from an output of group 20. In such a case, nodes A and B transition, thereby setting the state of logic gates 32 and 34 (described below). Then, sampling signal sample transitions "high" to sample the arbiter state. As described further below with reference to FIG. 2, if signal get_data is "low," signals out_1 and out_2 are either "low" and "high" or "high" and "low," respectively. Next, as further described below with reference to FIG. 3, signal clock may be asserted, thereby shifting the data left or right or not shifting at all. No shift may occur if the logic gates 32 and 34 become metastable, in which case their outputs may be interpreted as being "low" (due to, for example, the design of logic gates 36 and 38). Thus, a metastable state of logic gates 32 and 34 results in no shift.

Referring again to FIG. 2, if node A transitions "high" and then node B transitions "high," sampling signal sample is asserted "high" after the transition on node B, thereby causing logic gates 36 and 38 to output "low" and "high," respectively. Accordingly, (i) logic gate 42 has two "low" inputs, thereby causing logic gate 42 to output "high" on signal out_1 due to the NOR functionality of logic gate 42, and (ii) logic gate 44 has two "high" inputs, thereby causing logic gate 44 to output "low" on signal out_2 due to the NAND functionality of logic gate 44.

If node B transitions "high" and then node A transitions "high," sampling signal sample is asserted "high" after the transition on node A, thereby causing logic gates 36 and 38 to output "high" and "low," respectively. Accordingly, (i) logic gate 42 has one "low" input and one "high" input, thereby causing logic gate 42 to output "low" on signal out_1 due to the NOR functionality of logic gate 42, and (ii) logic gate 44 has one "low" input and one "high" input, thereby causing logic gate 44 to output "high" on signal out_2 due to the NAND functionality of logic gate 44.

If node A and node B transition "high" at the same time, then logic gates 32 and 34 become metastable, in which case the outputs of logic gates 32 and 34 are interpreted as "low" by logic gates 36 and 38, respectively. Thus, when the sampling signal sample is asserted "high," logic gates 38 and 36 respectively output "high" due to the NAND functionalities of logic gates 38 and 36. Accordingly, (i) logic gate 42 has one "low" input and one "high" input, thereby causing logic gate 42 to output "low" on signal out_1 due to the NOR functionality of logic gate 42, and (ii) logic gate 44 has two "high" inputs, thereby causing logic gate 44 to output "low" on signal out_2 due to the NAND functionality of logic gate 44.

Accordingly, (i) when node A transitions "high" and then node B transitions "high," signals out_1 and out_2 go "high" and "low," respectively, (ii) when node B transitions "high" and then node A transitions "high," signals out_1 and out_2 go "low" and "high," respectively, and (iii) when nodes A and B transition "high" at the same time, signals out_1 and out_2 go "low."

Those skilled in the art will note that although FIG. 2 shows particular types of logic gates, in one or more other embodiments of the present invention, different numbers and types of logic gates may be implemented.

Figure 3:
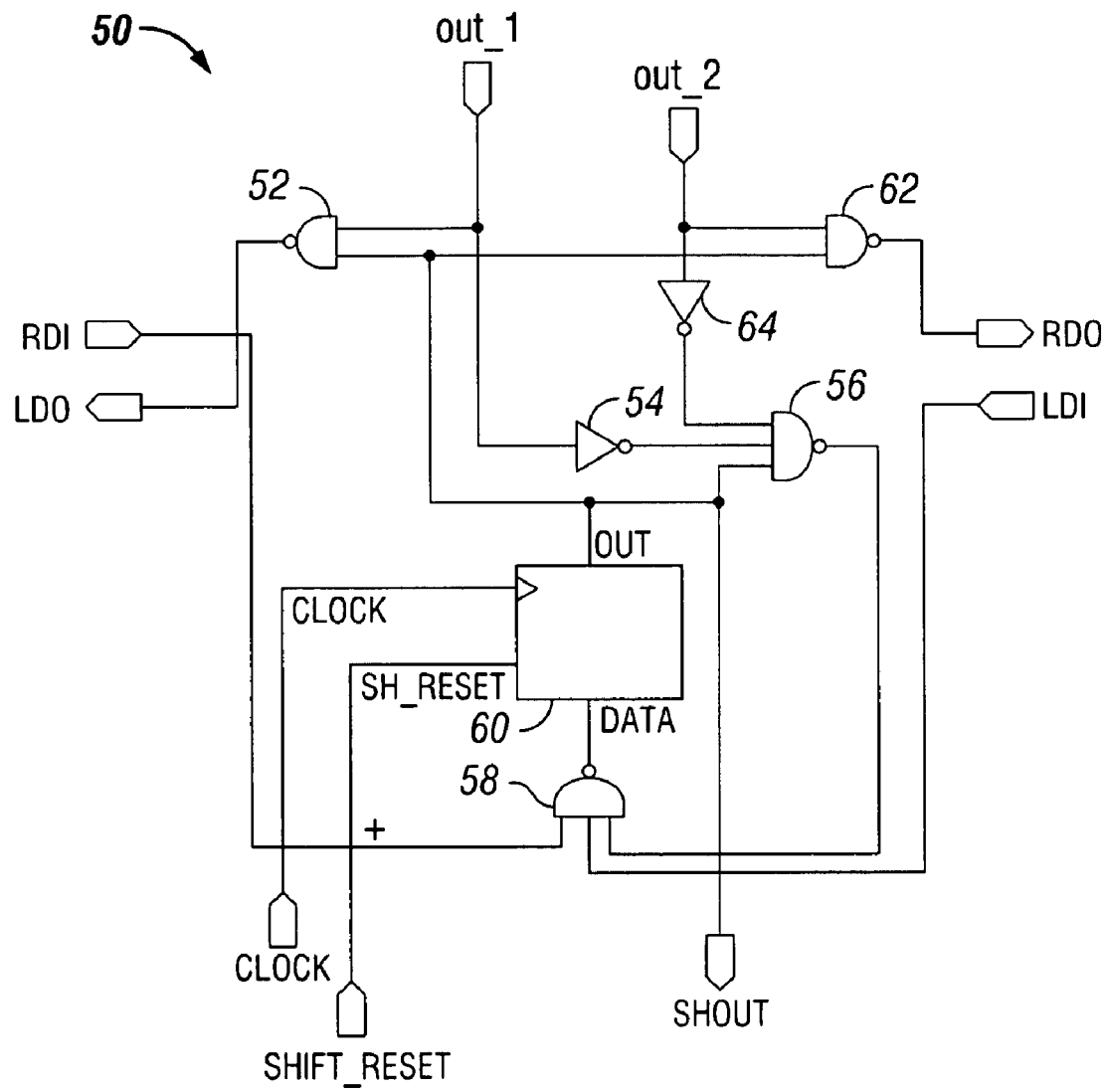
FIG. 3 shows a portion of an analog-to-digital converter in accordance with an embodiment of the present invention.

FIG. 3 shows an example of a portion of an analog-to-digital converter in accordance with an embodiment of the present invention. Particularly, FIG. 3 shows a circuit schematic of an example of one stage of a shift register 50 usable in the analog-to-digital converter 10 shown in FIG. 1. In other words, FIG. 3 shows one stage of several stages connected and implemented as an n-bit shift register.

Signal out_1 serves as an input to logic gate 52 and inverter 54. Inverter 54 outputs to an input of logic gate 56. Logic gate 56 outputs to an input of logic gate 58. Moreover, input signals rdi ("right data in") and ldi ("left data in") serve as inputs to logic gate 58. Logic gate 58 outputs to an input of flip-flop 60. Moreover, input signals clk ("clock") and shift_reset ("shift reset") (may be used to reset the shift register) serve as inputs to flip-flop 60. Flip-flop 60 has an output connected to inputs of logic gate 52, 56, and 62. Logic gate 52 has an output that serves as signal ldo ("left data out"). Further, the output of flip-flop 60 serves as signal shout ("shift out").

Signal out_2 serves as an input to logic gate 62 and inverter 64. Inverter 64 has an output that is connected to an input of logic gate 56. Logic gate 62 has an output that serves as signal rdo ("right data out").

When signals out_1 and out_2 are both "low," inverters 54 and 64 both output "high" to inputs of logic gate 56. As described above, the values of signals out_1 and out_2 help determine whether a "high" will be shifted left or right or not shifted at all in the shift register. If both signals out_1 and out_2 are "low," then a "high" is not shifted into the shift register. Thus, logic gate 58 outputs "high" due to it having at least one "low" input. As described further below with reference to FIG. 4, flip-flop 60 outputs "high" when signal clock is asserted and its input is "high." Accordingly, (i) logic gate 52 has one "high" input and one "low" input, thereby causing logic gate 52 to output "high" on signal ldo due to the NAND functionality of logic gate 52, (ii) logic gate 62 has one "high" input and one "low" input, thereby causing logic gate 62 to output "high" on signal rdo due to the NAND functionality of logic gate 62, and (iii) signal shout goes or remains "high."

When signal out_1 is "high" and signal out_2 is "low," inverters 54 and 64 respectively output "low" and "high" to inputs of logic gate 56. As described above, the values of signals out_1 and out_2 help determine whether a "high" will be shifted left or right or not shifted at all in the shift register. If signals out_1 is "high" and signal out_2 is "low," then a "high" is shifted left from signal ldi to the flip-flop 60. Thus, logic gate 58 outputs "high" due to it having at least one "low" input. As described further below with reference to FIG. 4, flip-flop 60 outputs "high" when signal clock is asserted and its input is "high." Accordingly, (i) logic gate 52 has two "high" inputs, thereby causing logic gate 52 to output "low" on signal ldo due to the NAND functionality of logic gate 52, (ii) logic gate 62 has one "high" input and one "low" input, thereby causing logic gate 62 to output "high" on signal rdo due to the NAND functionality of logic gate 62, and (iii) signal shout goes or remains "high."

When signal out_1 is "low" and signal out_2 is "high," inverters 54 and 64 respectively output "high" and "low" to inputs of logic gate 56. As described above, the values of signals out_1 and out_2 help determine whether a "high" will be shifted left or right or not shifted at all in the shift register. If signals out_1 is "low" and signal out_2 is "high," then a "high" is shifted right from signal rdi to the flip-flop 60. Thus, logic gate 58 outputs "high" due to it having at least one "low" input. As described further below with reference to FIG. 4, flip-flop 60 outputs "high" when signal clock is asserted and its input is "high." Accordingly, (i) logic gate 52 has one "high" input and one "low" input, thereby causing logic gate 52 to output "high" on signal ldo due to the NAND functionality of logic gate 52, (ii) logic gate 62 has two "high" inputs, thereby causing logic gate 62 to output "low" on signal rdo due to the NAND functionality of logic gate 62, and (iii) signal shout goes or remains "high."

Accordingly, in view of the above description of FIG. 3, for each "high" assertion of signal clock, a '1' bit is either shifted left or right (or no shift at all) as a function of signals out_1 and out_2.

Those skilled in the art will note that although FIG. 3 shows particular types of logic gates, in one or more other embodiments of the present invention, different numbers and types of logic gates may be implemented.

Figure 4:
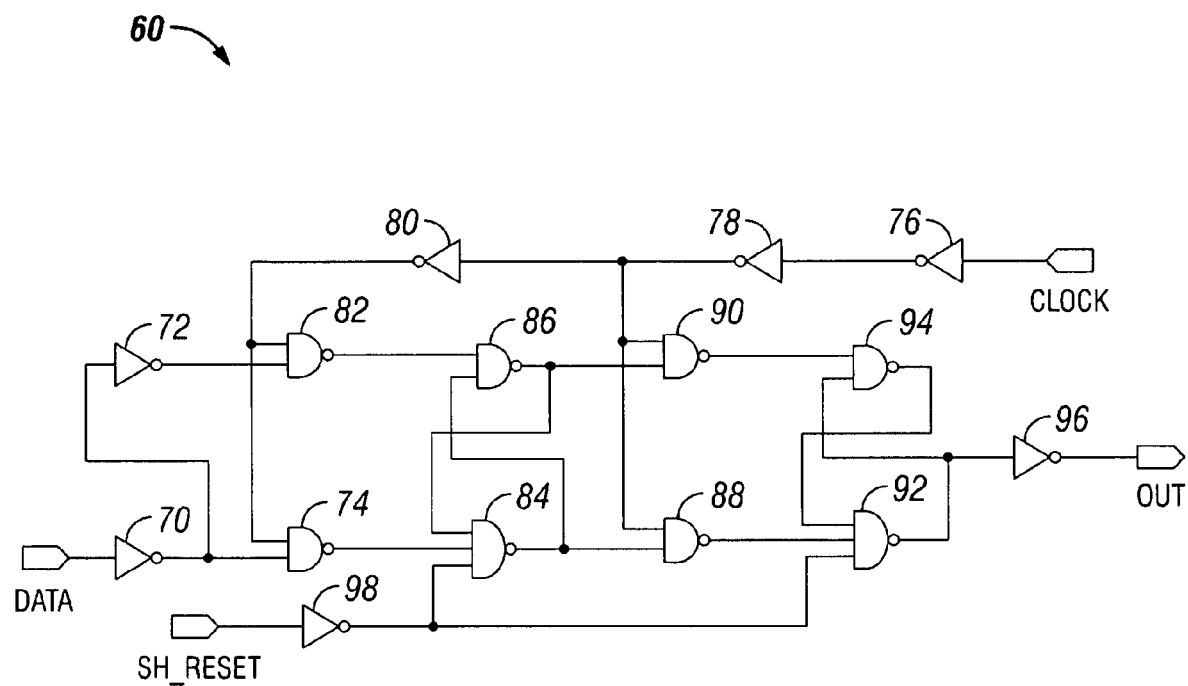
FIG. 4 shows a portion of an analog-to-digital converter in accordance with an embodiment of the present invention.

FIG. 4 shows an example of a portion of an analog-to-digital converter in accordance with an embodiment of the present invention. Particularly, FIG. 4 shows a circuit schematic of an example of a portion of a flip-flop 60 usable in the shift register 50 shown in FIG. 3. Those skilled in the art will note that the circuit schematic shown in FIG. 4 may represent a master-slave flip-flop.

A data signal data serves as an input to an inverter 70 that outputs to inputs of inverter 72 and logic gate 74. An inverted and delayed version of signal clock (via inverters 76, 78, 80) serves as inputs to logic gate 74 and logic gate 82. The output of inverter 72 is also connected to an input of logic gate 82. Logic gate 74 outputs to an input of logic gate 84. An inverted and delayed version of signal sh_reset also serves as an input to logic gate 84. Another input of logic gate 84 is connected to an output of logic gate 86. An output of logic gate 82 is connected to an input of logic gate 86. Further, an output of logic gate 84 is connected to an input of logic gate 86. Accordingly, logic gates 84 and 86 may be referred to as being "cross-coupled."

An output of logic gate 84 is connected to an input of logic gate 88. A delayed version of signal clock also serves as an input to logic gate 88. Logic gate 88 outputs to an input of logic gate 92. The inverted and delayed version of signal sh_reset also serves as an input to logic gate 92. Further, in addition to having an output serving as signal out, the output of logic gate 92 is connected to an input of logic gate 94. An output of logic gate 94 is also connected to an input of logic gate 92. In addition to having an input connected to an output of logic gate 92, logic gate 94 has an input connected to an output of logic gate 90. Logic gate 90 has an input connected to an output of logic gate 86. Further, the delayed version of signal clock also serves as an input to logic gate 90.

When signal sh_reset is asserted, i.e., goes "high," inverter 98 outputs "low" to an input of logic gate 92, thereby causing logic gate 92 to output "high" on signal out due to the NAND functionality of logic gate 92. Thus, when signal sh_reset is asserted, signal out goes "high" regardless of the states of the data signal data and signal clock.

When the data signal data is "high" (and signal sh_reset is not asserted), a "high" is latched at an output of logic gate 86 and a "low" is latched at an output of logic gate 84 due to the functionalities of inverters 70, 72, and 98 and NAND gates 74, 82, 84, and 86. When signal clock goes "high," (i) logic gate 88 has one "low" input and one "high" input, thereby causing logic gate 88 to output "high" due to the NAND functionality of logic gate 88, and (ii) logic gate 90 has two "high" inputs, thereby causing logic gate 90 to output "low" due to the NAND functionality of logic gate 90. Accordingly, logic gate 94, which has at least one "low" input, outputs "high." Thus, logic gate 92, which has all inputs "high," outputs "low" to inverter 96, which, in turn, outputs "high" on signal out.

When the data signal data is "low" (and signal sh_reset is not asserted), a "low" is latched at an output of logic gate 86 and a "high" is latched at an output of logic gate 84 due to the functionalities of inverters 70, 72, and 98 and NAND gates 74, 82, 84, and 86. When signal clock goes "high," (i) logic gate 88 has two "high" inputs, thereby causing logic gate 88 to output "low" due to the NAND functionality of logic gate 88, and (ii) logic gate 90 has one "high" input and one "low" input, thereby causing logic gate 90 to output "high" due to the NAND functionality of logic gate 90. Accordingly, logic gate 92, which has at least one "low" input, outputs "high" to inverter 96, which, in turn, outputs "low" on signal out.

Those skilled in the art will note that although FIG. 4 shows particular types of logic gates, in one or more other embodiments of the present invention, different numbers and types of logic gates may be implemented.

The behavior of the flip-flop 60 described above with reference to FIG. 4 is applicable in the operation of the portion of the shift register 50 shown in FIG. 3. Now also referring to FIG. 1, the values of signals rdo and ldo shown in FIG. 3 may be used to adjust the delay of one or more of the delay elements in group 16.

Advantages of the present invention may include one or more of the following. In one or more embodiments of the present invention, because a sensitive parameter of an analog-to-digital converter is delay, one or more high-precision devices required to detect/measure sensitive parameters such as, for example, light, temperature, and pressure, may not be needed in a computer system.

In one or more embodiments of the present invention, an analog-to-digital converter is asynchronous, i.e., is not dependent on an external clock signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a first plurality of delay elements having a delay dependent on an analog signal;
   a second plurality of delay elements having a delay dependent on a digital signal; and
   circuitry arranged to adjust the digital signal dependent on an output of the first plurality of delay elements and an output of the second plurality of delay elements.

2. The computer system of claim 1, wherein a feedback signal serves as an input to the first plurality of delay elements and the second plurality of delay elements.

3. The computer system of claim 2, wherein the feedback signal is dependent on the output of the first plurality of delay elements and the output of the second plurality of delay elements.

4. The computer system of claim 1, the circuitry comprising:
   an arbiter circuit arranged to output a first signal and a second signal dependent on a comparison of a phase of the output of the first plurality of delay elements and a phase of the output of the second plurality of delay elements.

5. The computer system of claim 4, the circuitry further comprising:
   a shift register arranged to output a control signal dependent on the first signal and the second signal, wherein the digital signal is dependent on the shift register.

6. A computer system, comprising:
   circuitry arranged to generate a digital signal dependent on an arrival time of a first signal at a first input thereto and an arrival time of a second signal at a second input thereto;
   a first delay element having a delay dependent on an analog signal, wherein the first signal is dependent on the first delay element; and
   a second delay element having a delay dependent on the digital signal, wherein the second signal is dependent on the second delay element.

7. The computer system of claim 6, the circuitry comprising:
   an arbiter circuit arranged to compare the arrival time of the first signal and the arrival time of the second signal.

8. The computer system of claim 7, the circuitry comprising:
   a shift register arranged to generate the digital signal dependent on at least one output of the arbiter circuit.

9. The computer system of claim 6, further comprising:
   a third delay element having an input dependent on both an output of the first delay element and an output of the second delay element.

10. The computer system of claim 9, wherein an input of the first delay element and an input of the second delay element are dependent on an output of the third delay element.

11. A computer system, comprising:
    a first delay chain having an output operatively connected to a first node, wherein a delay of the first delay chain is dependent on an analog signal operatively connected to the first delay chain;
    a second delay chain having an output operatively connected to a second node, wherein a delay of the second delay chain is dependent on a digital signal operatively connected to the second delay chain; and circuitry arranged to adjust the digital signal dependent on a first input thereto and a second input thereto, the first input operatively connected to the first node and the second input operatively connected to the second node.

12. The computer system of claim 11, further comprising:
a third delay chain having an output operatively connected to a third node, the third node operatively connected to an input of the first delay chain and an input of the second delay chain, wherein an input to the third delay chain is dependent on the first node and the second node.

13. The computer system of claim 12, wherein the input to the third delay chain is operatively connected to a Mueller element.

14. The computer system of claim 11, the circuitry comprising:
an arbiter circuit arranged to compare a phase of a signal at the first input and a phase of a signal at the second input.

15. The computer system of claim 11, the circuitry comprising:
a shift register arranged to output the digital signal dependent on a comparison of a signal at the first input and a signal at the second input.

16. The computer system of claim 15, wherein bits in the shift register are shifted one of left and right dependent on the comparison.

17. A method of performing computer system operations, comprising:
inputting an analog signal;
delaying a first signal dependent on the analog signal;
comparing the first signal and a second signal;
generating a digital signal dependent on the comparing, wherein a delay of the second signal is dependent on the digital signal.

18. The method of claim 17, the comparing comprising:
outputting a signal dependent on a comparison of a phase of the first signal and a phase of the second signal.

19. The method of claim 17, wherein the digital signal is dependent on a plurality of bits, the method further comprising:
one of shifting the bits right and shifting the bits left dependent on the comparing.

20. The method of claim 17, further comprising:
delaying a third signal dependent on the first signal and the second signal.

21. The method of claim 20, wherein the first signal and the second signal are dependent on the third signal.

* * * * *